(12) United States Patent
Kalyoncu et al.

(10) Patent No.: US 9,812,202 B2
(45) Date of Patent: Nov. 7, 2017

(54) THREE DIMENSIONAL OPTO-MAGNETIC DATA STORAGE SYSTEM AND METHOD

(71) Applicants: Yemliha Bilal Kalyoncu, Istanbul (TR); Ozhan Ozatay, Istanbul (TR)

(72) Inventors: Yemliha Bilal Kalyoncu, Istanbul (TR); Ozhan Ozatay, Istanbul (TR)

( * ) Notice: Subject to any disclaimer, the term of this patent is extended or adjusted under 35 U.S.C. 154(b) by 89 days.

(21) Appl. No.: 14/758,193

(22) PCT Filed: Dec. 26, 2013

(86) PCT No.: PCT/IB2013/061337
§ 371 (c)(1),
(2) Date: Jun. 26, 2015

(87) PCT Pub. No.: WO2014/102728
PCT Pub. Date: Jul. 3, 2014

(65) Prior Publication Data
US 2015/0357039 A1    Dec. 10, 2015

(30) Foreign Application Priority Data

Dec. 26, 2012    (TR) .............................. a 2012/15356

(51) Int. Cl.
*G11C 7/00*    (2006.01)
*G11C 13/04*    (2006.01)
(Continued)

(52) U.S. Cl.
CPC .............. *G11C 13/06* (2013.01); *G11C 5/02* (2013.01); *G11C 11/161* (2013.01);
(Continued)

(58) Field of Classification Search
CPC ..... G11C 7/1081; G11C 11/42; G11C 13/043; G11C 13/044; G11C 13/047;
(Continued)

(56) References Cited

U.S. PATENT DOCUMENTS

2011/0058458 A1    3/2011    Rasing et al.
2011/0141792 A1    6/2011    Ozatay et al.

FOREIGN PATENT DOCUMENTS

JP              62184644       8/1987
WO       WO2012019806 A1     2/2012

OTHER PUBLICATIONS

C.D. Stanciu et al: "All-Optical Magnetic Recording with Circularly Polarized Light", PRL 99, 047601, 2007.
(Continued)

*Primary Examiner* — Kretelia Graham
(74) *Attorney, Agent, or Firm* — Gokalp Bayramoglu

(57) ABSTRACT

The present invention relates to a data storage system and a method which has high storing capacity and high data access rate and low power consumption. The said data storage system essentially includes at least two optical layers, and which have at least one active layer in which the light is generated, at least one lower electric contact enabling the electric energy to be transferred to the active layer and at least one upper electric contact, at least two reflecting layers reflecting the light generated in the active layer; at least one thermal insulator; at least one magnetic layer, which has at least one storage bit, at least one lower buffer bit, at least one upper buffer bit enabling the data to be transferred up; at least one transparent layer and transfers the light generated by the optical unit to the magnetic layer.

14 Claims, 7 Drawing Sheets

(51) Int. Cl.
  *G11C 13/06*  (2006.01)
  *G11C 5/02*  (2006.01)
  *G11C 19/08*  (2006.01)
  *G11C 19/30*  (2006.01)
  *G11C 11/16*  (2006.01)

(52) U.S. Cl.
  CPC ...... *G11C 11/1675* (2013.01); *G11C 19/0841* (2013.01); *G11C 19/30* (2013.01)

(58) Field of Classification Search
  CPC ....... G11C 13/048; G11C 13/06; G11C 13/04; G11C 5/02; G11C 19/30
  See application file for complete search history.

(56) References Cited

OTHER PUBLICATIONS

Holub & Bhattacharya. J.Phys D: "Spin-polarized light-emitting diodes and lasers", Appl Phys, 40, 2007.

Holub M. et al: "Electrical Spin Injection and threshold Reduction in a Semiconductor Laser", Phys. Rev. Let. 98, 146603, 2007.

Hayashi M. et al: "Current Driven Domain Wall Velocities Exceeding the Spin Angular Momentum Transfer Rate in Permalloy Nanowires", Phys. Rev. Let. 98, 037204, 2007.

THREE DIMENSIONAL OPTO-MAGNETIC DATA STORAGE SYSTEM AND METHOD

FIELD OF THE INVENTION

The present invention relates to a three dimensional opto-magnetic data storage system and method which enables the data to be stored optomagnetically.

BACKGROUND OF THE INVENTION

As of the computers being used, there is a requirement to identify the functions, which are desired to be done, to the computer. In the beginning, the functions expected from the computers were informed to the computers via punched cards. The said punched cards are one of the primitive examples of data storage systems. The limited capacity of the punched cards made necessary to develop different data storage ways. The magnetic tapes having more data capacity than the punched cards have been developed for this need. Data, which can be stored in ten thousand punched cards, can be stored in some magnetic tapes. After magnetic tapes, the diskettes having a magnetic disc therein have been developed. The said diskettes provide carrying the data as well as storing them. However, the said diskettes are not convenient to store data locally because of their limited capacity. Devices which are called hard drives and include storage area and reading/writing head therein have been developed for local storage in computers. With the increasing capacity need, the number of the storage areas within the hard drives and the data amount that can be stored in unit area of the storage unit have been increased. The said increases enable the capacity to be increased. The number of the read/write heads has also been increased in order to increase the access speed to the data stored in the said hard drives. With the increase in need to carry the data, the capacity of the portable media has also increased. CD; DVD. Blue-Ray etc. can be given as example for the said media.

Even though the capacities of the data storage media have increased, there is still need for storage area so large that it cannot be met by the said media. Especially the datacenters need storage area in very high capacities. Furthermore, access speed and recording speed of the said data is also important as well as the content on the stored data in order that the services to be served using the stored data will be fast.

Magnetic data storage operates based on changing the orientations of the magnetic dipoles. The magnetic domains wherein the orientations of all magnetic dipoles are same represent one bit. In optical storing methods, craters and non-crater areas present on the surface of the optical medium represent bits.

In the state of the art, there are optomagnetic (or magneto-optic) data storage units the orientation of the magnetic dipoles of which can be changed optically. Recording in the said storage area is realized on a ferromagnetic material coated on a disc. This ferromagnetic material is generally located inside the sheath which preserves it from dust. The biggest problems of magnetic storage units are the storage areas. One of the reasons for this size problem is that in case the recording density on a recording medium (data amount on a unit area) exceeds a determined value, the interaction between the bits increases and the thermal stability decreases. The said problem is generally called as superparamagnetic effect. One way to overcome this superparamagnetic effect is to use recording media having a high magnetic anisotropic energy density. However, this requires using high magnetic fields to change the magnetization of the recording medium that will not be practical.

Japanese Patent document no JP62184644, an application known in the state of the art, discloses a medium for optomagnetic memory. The said medium can easily be rewritten and it is stable against the outer magnetic fields. In the said document, it is disclosed that a laser light is focused to a film by a lens, and the film is heated by means of the focused laser light. Therefore, antiferromagnetic layer demagnetizes. In the meantime, by means of an external magnetic field applied on the film, the said desired information can be written on this area, the information which is written can remain here when the related area is cooled.

United States Patent document no US20110058458, an application known in the state of the art, discloses magneto-optical switching device for switching magnetization in a medium, comprising a magnetizable medium.

In the article titled "All-Optical Magnetic Recording with Circularly Polarized Light" (C. D. Stanciu et. Al., PRL 99, 047601 (2007)), in the state of the art, a study is disclosed wherein the magnetization can be reversed using 40 femtoseconds laser pulses, without applying any magnetic field.

In the article titled "Spin-polarized light-emitting diodes and lasers" (Holub and Bhattacharya. J. Phys D:Appl Phys. 40(2007) R179-R203), in the state of the art, it is disclosed the spin polarized light sources and that the combinations of spin polarized carriers that will emit provide circularly polarized light.

In the article titled "Electrical Spin Injection and threshold Reduction in a Semiconductor Laser" (Holub M. et.al. Phys. Rev. Let. 98, 146603 (2007)), in the state of the art, spin polarized vertical cavity surface emitting laser with electron spin injection from Schottky tunnel barrier are shown.

In the article titled "Current Driven Domain Wall Velocities Exceeding the Spin Angular Momentum Transfer Rate in Permalloy Nanowires" (Hayashi M, et.al. Phys. Rev. Let. 98, 037204 (2007)), in the state of the art, it is disclosed that different driving mechanisms for current densities which exceeds the threshold value for transferring spin angular momentums of spin polarized electrons to the domain wall.

SUMMARY OF THE INVENTION

The objective of the present invention is to provide a three dimensional opto-magnetic data storage system and method which has high storage capacity.

Another objective of the present invention is to provide a three dimensional opto-magnetic data storage system and method which has low power consumption.

Another objective of the present invention is to provide a three dimensional opto-magnetic data storage system and method which has high data access speed.

Yet another objective of the present invention is to provide a three dimensional opto-magnetic data storage system and method wherein the read/write errors are decreased.

Another objective of the present invention is to provide a three dimensional opto-magnetic data storage system and method wherein the data transfer can be performed up and down.

BRIEF DESCRIPTION OF THE DRAWINGS

The data storage system and method developed to fulfill the objectives of the present invention is illustrated in the accompanying figures, in which.

Figure 1:
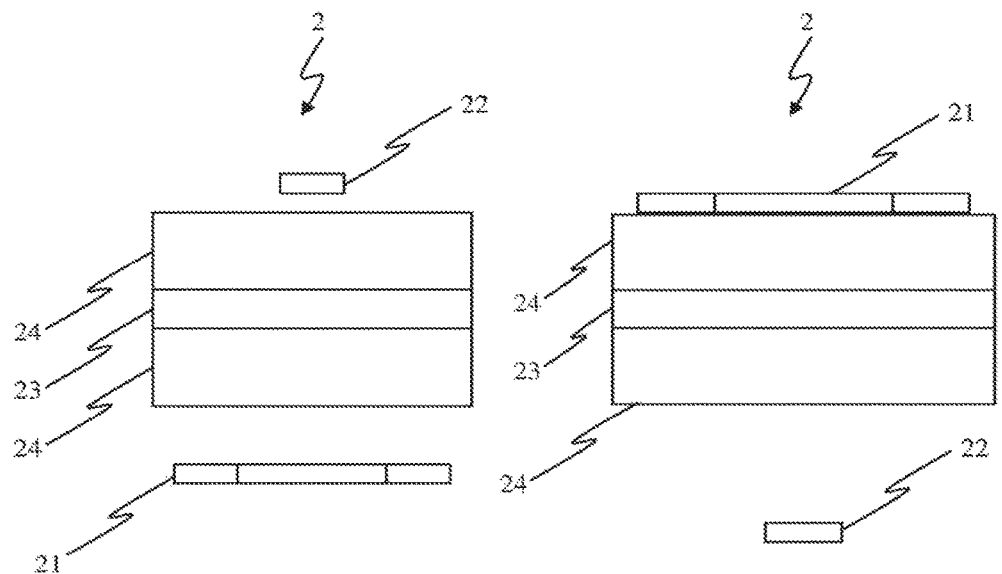
FIG. 1 is the various schematic view of the optical unit.
Figure 2:
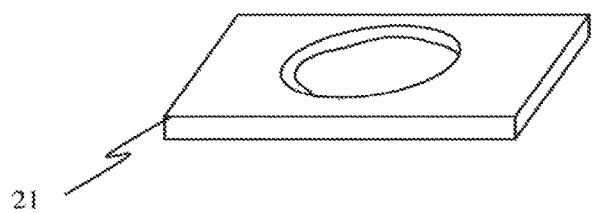
FIG. 2 is the view of the lower electric contact.
Figure 3:
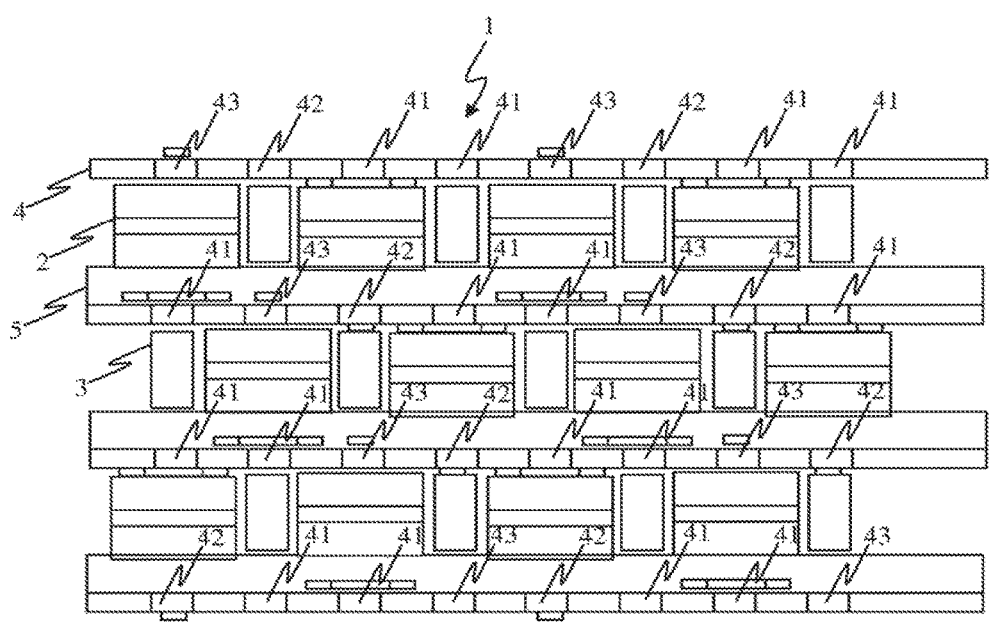
FIG. 3 is one view of the three dimensional opto-magnetic data storage system.
Figure 4:
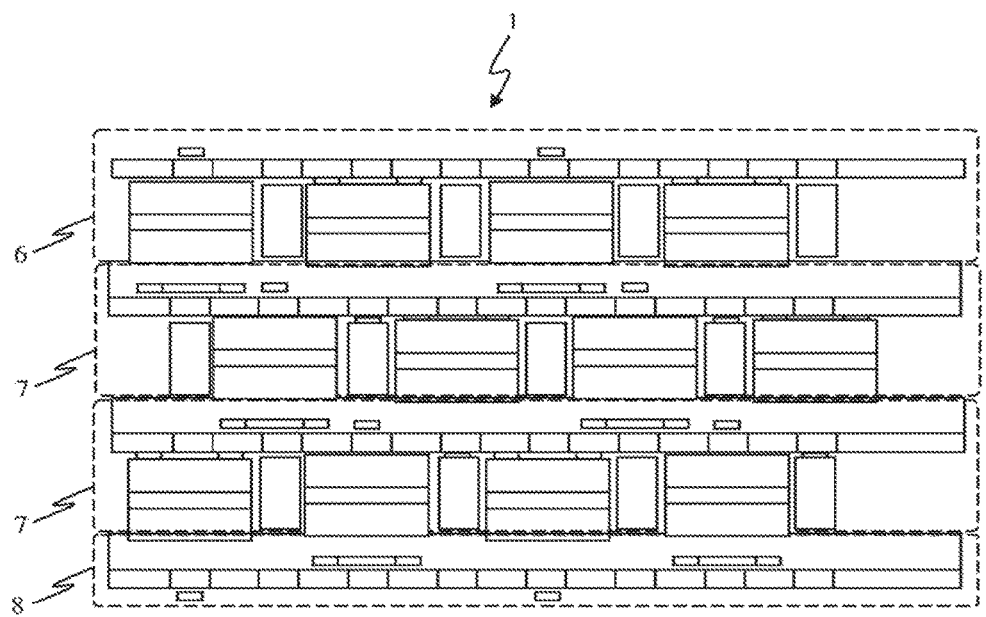
FIG. 4 is another view of the three dimensional opto-magnetic data storage system.
Figure 5A:
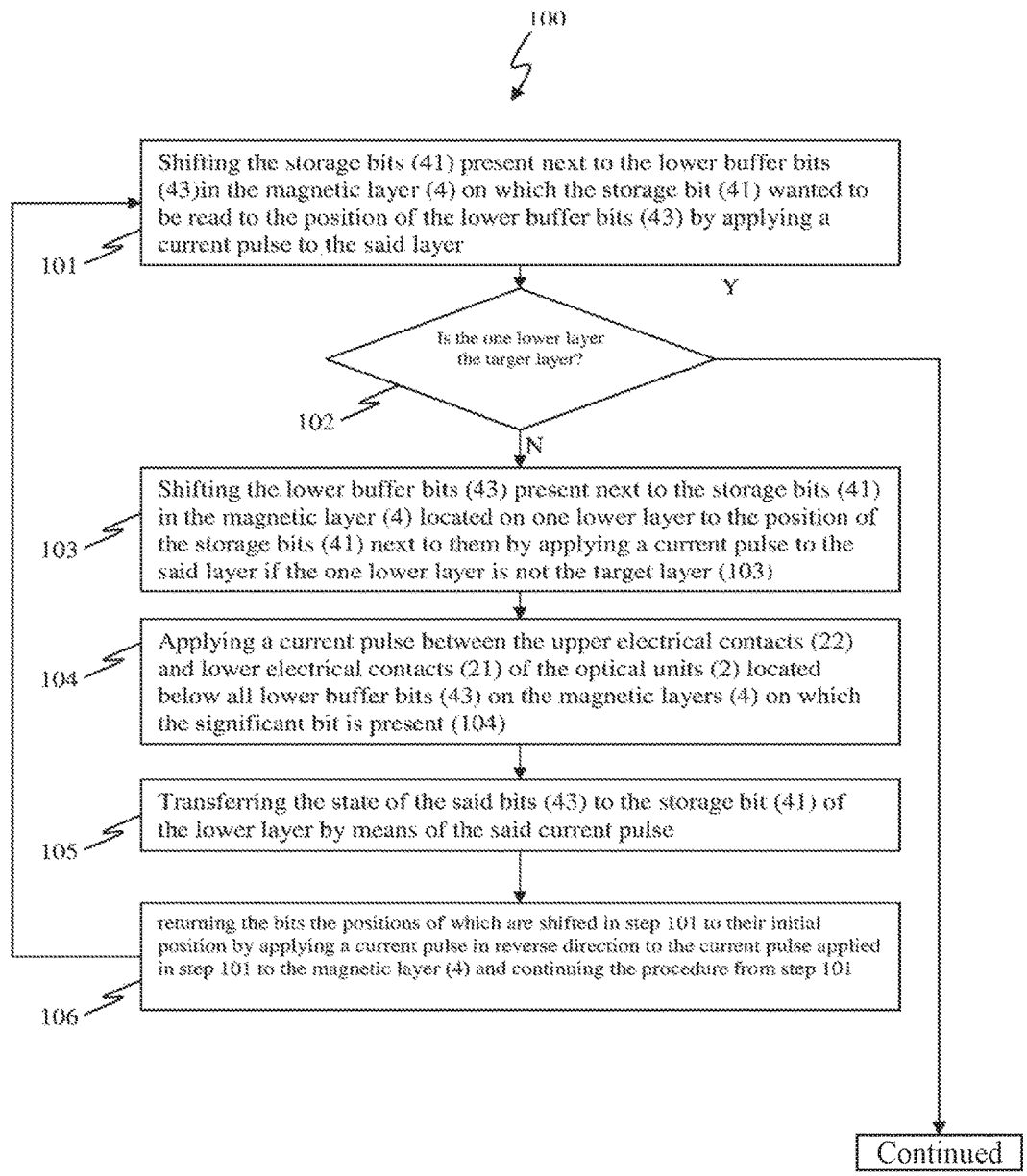
FIG. 5A and FIG. 5B together form the flow chart of the down transfer process.
Figure 5B:
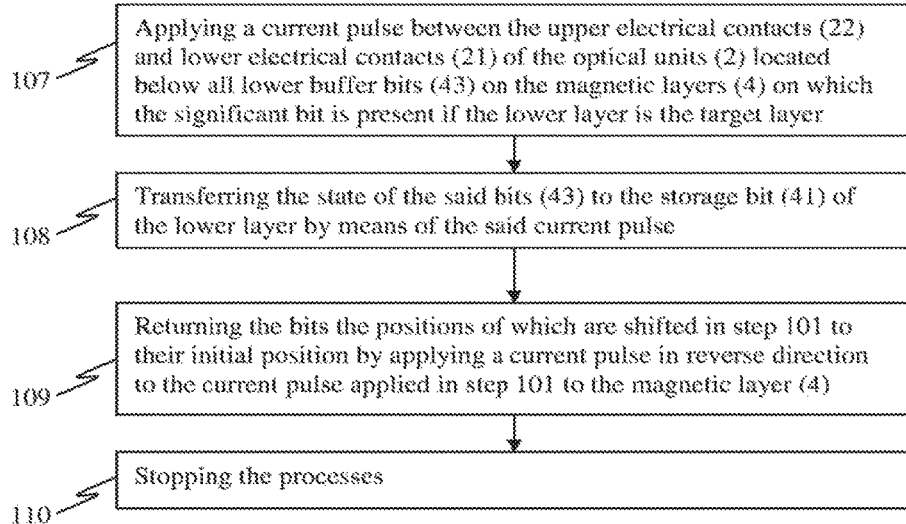
Figure 6A:
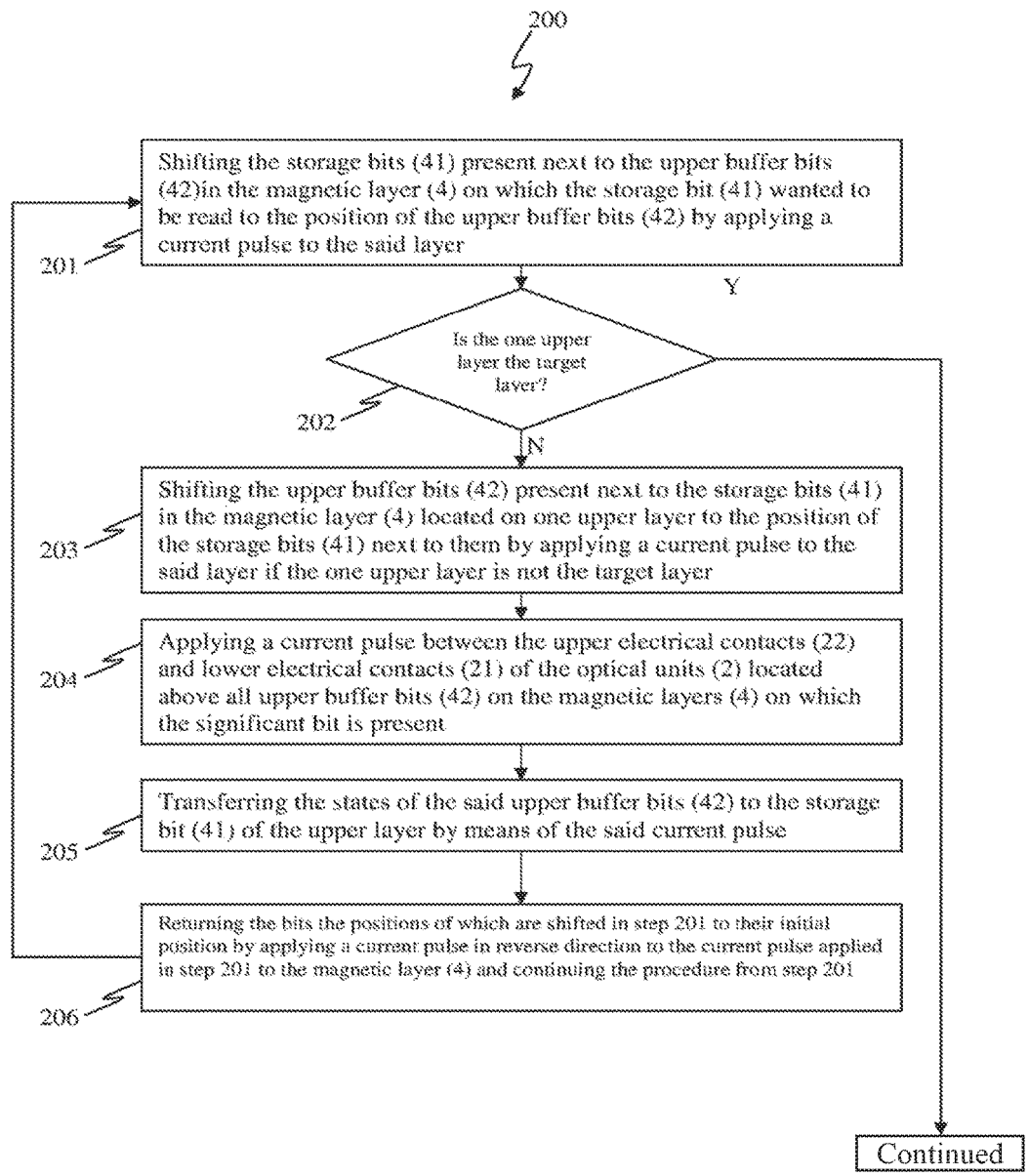
FIG. 6A and FIG. 6B together form the flow chart of the up transfer process.
Figure 6B:
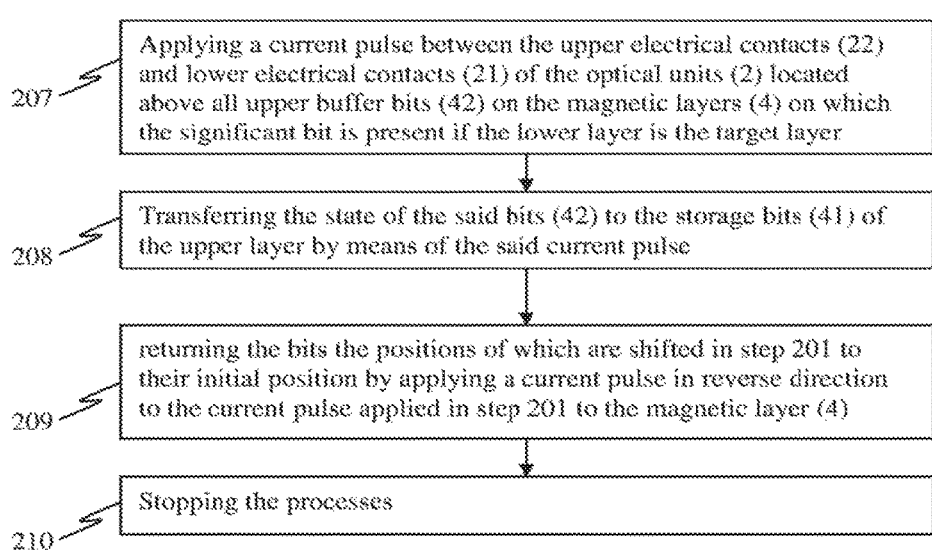

The components shown in the figures are each given reference numerals as follows:
1. Three dimensional opto-magnetic data storage system
2. Optical unit
   21. Lower electric contact
   22. Upper electric contact
   23. Active layer
   24. Reflecting layer
3. Thermal insulator
4. Magnetic layer
   41. Storage bit
   42. Upper buffer bit
   43. Lower buffer bit
5. Transparent layer
6. Top layer
7. Intermediate layer
8. Bottom layer

DETAIL DESCRIPTION OF THE INVENTION

The inventive three-dimensional data storage system (1) essentially comprises
  at least two optical layers (2) which enable the circularly polarized light required for recording data to be generated, and have at least one active layer (23) in which the light is generated, at least one lower electric contact (21) enabling the electric energy to be transferred to the active layer (23) and having a circular shaped hole at the center such that it will allow the light to pass, at least one upper electric contact (22) enabling the electric energy to be transferred to the active layer (23), at least two reflecting layers (24) reflecting the light in the active layer (23),
  at least one thermal insulator (3) which prevents the heat transfer between two adjoining optical layers (2),
  at least one magnetic layer (4) which is manufactured from a ferromagnetic material suitable for optomagnetic recording, which has at least two storage bits (41) and at least one upper buffer bit (42) enabling the data to be transferred up, and at least one lower buffer bit (43) enabling the data to be transferred downward therein,
  at least one transparent layer (5) which is located on the magnetic layer (4) and transfers the light generated by the optical unit (2) to the magnetic layer (4).

In the preferred embodiment of the invention, the data storage system (1) comprises
  at least one top layer (6) which has at least two optical units (2) arranged side by side such that they will have space in between them, at least one thermal insulator (3) present in the space between the optical units (2), and at least one magnetic layer (4) located on the plane formed by the optical units (2) and the thermal insulator (3),
  at least one intermediate layer (7) which is located under the top layer (6), has at least two optical units (2) arranged side by side such that they will have space in between them, at least one thermal insulator (3) present in the space between the optical units (2), at least one magnetic layer (4) present on the plane formed by the optical units (2) and the thermal insulator (3), and at least one transparent layer (5) present on the magnetic layer (4),
  at least one bottom layer (8) which is located under the intermediate layer (7), has at least one magnetic layer (4) and at least one transparent layer (5) located on the magnetic layer (4).

In the preferred embodiment of the invention, there are more than one intermediate layers in order to increase the capacity of the data storage system (1). The number of the said intermediate layers and thus the storage area can be increased as much as desired. In the said embodiment, the first intermediate layer (7) is present under the top layer (6), The next intermediate layers (7) are placed on top of each other such that they will be under the first intermediate layer (7). The bottom layer (8) is present below the intermediate layer (7) which is under the said intermediate layers (7).

In the preferred embodiment of the invention, the bits (41, 42, 43) located on the magnetic, layer (4) which a layer has are aligned such that one lower buffer bit (43) will be next to two storage bits (41) and one upper buffer bit (42) will be next to the lower buffer bit (43). The group comprised of one lower buffer bit (43) located next to two storage bits (41) and one upper buffer bit (42) located next to the said lower buffer bit (43) are added one after another so that the storage area is increased.

In a preferred embodiment of the invention, one of the optical units (2) is positioned such that it will be above the upper buffer bit (42) present within the magnetic layer (4) which the one level below intermediate layer (7) or the bottom layer (8) has, and the other one is positioned such that it will be under the lower buffer bit (43) present within the magnetic layer which the one level above intermediate layer (7) or the top layer (6) has. The optical unit (2) positioned such that it will be above the upper buffer bit (42) present within the magnetic layer (4) which the one level below intermediate layer (7) or the bottom layer (8) has is called as the top emitting optical unit (2), and the optical unit (2) positioned such that it will be under the lower buffer bit (43) present within the magnetic layer which the one level above intermediate layer (7) or the top layer (6) has is called as bottom emitting optical unit (2). In this embodiment, some of the thermal insulators (3) located between two optical units (2) in the same layer are positioned such that they will be between the upper buffer bit (42) which the said layer has and the lower buffer bit (43) which the one lower layer has. The other part of the said thermal insulators (3) are positioned such that they will be between the storage bit (41) which the layer on which the said optical bits (2) are present and the storage bit (41) which one lower layer has and which is right under the said storage bit (41).

In the preferred embodiment of the invention, the reflecting layer (24) which the optical unit (2) has is formed by arranging the layers having the thickness as whole multiples of the quarter of the wavelength of the light generated by the active layer (23) on top of each other. The said reflector is also called as distributed Bragg reflector. In this embodiment, there is one reflecting layer (24) each under and on the active layer (23).

In the preferred embodiment of the invention, the upper electric contact (22), which the optical unit (2) located on the upper buffer bit (42) has, is positioned such that it will be between the magnetic layer (4) on which the said upper buffer bit (42) is located and the thermal insulator (3); and the lower electric contact (21) is positioned right under the magnetic layer (4) in the layer on which the said optical unit (2) is located. In this embodiment, the lower electric contact (21), which the optical unit (2) located below the lower buffer bit (43) has, is positioned such that it will he between the magnetic layer (4) located on one lower layer and the transparent layer (5), and the upper electric contact (22) is positioned right above the magnetic layer (4) located on the layer on which the said optical unit (2) is present. This placement makes it easy to produce the said data storage system (1).

In the preferred embodiment of the invention, the optical unit (2) emits circularly polarized electromagnetic wave. In case the current given to the optical unit (2) for generating a wave is spin polarized, the electric field component generated by the optical unit (2) rotates according to the direction of the said spin polarization. The upper buffer bit (42) or the lower buffer bit (43) between the upper electric contact (22) and the lower electric contact (21) of the optical unit (2) enable the current given to the optical unit (2) to be spin polarized. Rotational direction of the electric field oldie wave varies depending on the status of the upper buffer bit: (42) or lower buffer bit (43). For example, in case the upper buffer bit (42) or lower buffer bit (43) is 0, if the electric field component of the wave rotates clockwise; it rotates counter clockwise in case the upper buffer bit: (42) or lower buffer bit (43) is 1, or in case the upper buffer bit (42) or lower buffer bit (43) is 0, if the electric field component of the wave rotates counter clockwise, it rotates clockwise in case the upper buffer bit (42) or lower buffer bit (43) is 1. The wave the rotational direction of the Electric field component of which is determined according to the status of the upper buffer bit (42) or the lower buffer bit (43) is sent to the storage bit (41) in the target layer. Thus, the status of the storage bit (41) is determined according to the rotational direction of the electrical field component of this wave.

In the preferred embodiment of the invention, the case wherein the orientations of the magnetic dipoles forming the bits (41, 42, 43) are upwards is the case wherein the bits (41, 42, 43) are 0; and the case wherein the orientations of the magnetic dipoles forming the bits (41, 42, 43) are downwards is the case wherein the bits (41, 42, 43) are 1.

In another embodiment of the invention, the case wherein the orientations of the magnetic dipoles forming the bits (41, 42, 43) are upwards is the case wherein the bits (41, 42, 43) are 1; and the case wherein the orientations of the magnetic dipoles forming the bits (41, 42, 43) are downwards is the case wherein the bits (41, 42, 43) are 0.

In the preferred embodiment of the invention, which magnetic dipole orientations correspond to which bit state is defined by the user.

In the preferred embodiment of the invention, when the significant bit is wanted to be transferred upwards, the optical units (2) located on the tipper buffer bits (42) are used; and when the significant bit is wanted to be transferred upwards, the optical units (2) under the lower buffer bits (43) are used.

In case an electrical current is applied in accordance with the arrangement of the bits (41, 42, 43) on a magnetic layer (4), the said bits (41, 42, 43) shift in reverse direction to the applied electrical current. In other words, each storage bit (41) shifts to the position where the upper buffer bit (42) or lower buffer bit (43) next to itself is present, reversely to this current.

In the preferred embodiment of the invention, there are at least three empty bits present next to the bits at the far end of the magnetic layer (4).

In the inventive data storage method (100), the down transfer process comprises the steps of shifting the storage bits (41) present next to the lower buffer bits (43) in the magnetic layer (4) on which the storage bit (41) wanted to be read to the position of the lower buffer bits (43) by applying a current pulse to the said layer (101), determining whether the one lower layer is the target layer (102), shifting the lower buffer bits (43) present next to the storage bits (41) in the magnetic layer (4) located on one lower layer to the position of the storage bits (41) next to them by applying a current pulse to the said layer if the one lower layer is not the target layer (103), applying a current pulse between the upper electrical contacts (22) and lower electrical contacts (21) of the optical units (2) located below all lower buffer bits (43) on the magnetic layers (4) on which the significant bit is present (104), transferring the state of the said bits (43) to the storage bit (42) of the lower layer by means of the said current pulse (105), returning the bits the positions of which are shifted in step 101 to their initial position by applying a current pulse in reverse direction to the current pulse applied in step 101 to the magnetic layer (4) and continuing the procedure from step 101 (106), applying a current pulse between the upper electrical contacts (22) and lower electrical contacts (21) of the optical units (2) located below all lower buffer bits (43) on the magnetic layers (4) on which the significant bit is present if the lower layer is the target layer (107), transferring the state of the said bits (43) to the storage bit (41) of the lower layer by means of the said current pulse (108), returning the bits the positions of which are shifted in step 101 to their initial position by applying a current pulse in reverse direction to the current pulse applied in step 101 to the magnetic layer (4) (109), stopping processes (110).

In the inventive data storage method (100), the up transfer process comprises the steps of shifting the storage bits (41) present next to the upper buffer bits (42) in the magnetic layer (4) on which the storage bit (41) wanted to be read to the position of the upper buffer bits (42) by applying a current pulse to the said layer (201), determining whether the one upper layer is the target layer (202), shifting the upper buffer bits (42) present next to the storage bits (41) in the magnetic layer (4) located on one upper layer to the position of the storage bits (41) next to them by applying a current pulse to the said layer if the one upper layer is not the target layer (203), applying a current pulse between the upper electrical contacts (22) and lower electrical contacts (21) of the optical units (2) located above all upper buffer bits (42) on the magnetic layers (4) on which the significant bit is present (204), transferring the states of the said upper buffer bits (42) to the storage bit (41) of the upper layer by means of the said current pulse (205), returning the bits the positions of which are shifted in step 201 to their initial position by applying a current pulse in reverse direction to the current pulse applied in step 201 to the magnetic layer (4) and continuing the procedure from step 201 (206), applying a current pulse between the upper electrical contacts (22) and lower electrical contacts (21) of the optical units (2) located above all upper buffer bits (42) on the magnetic layers (4) on which the significant bit is present if the lower layer is the target layer (207), transferring the state of the said bits (42) to the storage bits (41) of the upper layer by means of the said current pulse (208), returning the bits the positions of which are shifted in step 201 to their initial position by applying a current pulse in reverse direction to the current pulse applied in step 201 to the magnetic layer (4) (209), stopping processes (210).

In the preferred embodiment of the invention, the storage bit (41) wanted to be read can be a storage bit (41) on the bottom layer (8) or the top layer (6) on which the data is recorded by an external writing head.

In the inventive data storage method (100), in down transfer process, the storage bits (41) present next to the lower buffer bits (43) in the magnetic, layer (4) on which the storage bit (41) wanted to be read are shifted to the position of the lower buffer bits (43) by applying a current pulse to the said layer (101). Then, whether the one lower layer is the target layer is determined (102). The lower buffer bits (43) present next to the storage bits (41) in the magnetic layer (4) located on one lower layer are shifted to the position of the storage bits (41) next to them by applying, a current pulse to the said layer if the one lower layer is not the target layer (103). The said method is called as spin-torque induced domain wall motion in the state of the art. Then, a current pulse is applied between the upper electrical contacts (22) and lower electrical contacts (21) of the optical units (2) located below all lower buffer bits (43) on the magnetic layers (4) on which the said lower buffer bit (43) is present (104). Therefore, all lower buffer bits (43) on the magnetic layer (4) on which the significant bit is present are copied to the storage bits (41) located on a lower layer corresponding right below the optical units (2) (105). After the data in the significant storage bit (41) is carried, the bits the positions of which are shifted in step 101 are returned to their initial positions by applying a current pulse in reverse direction to the current pulse applied in step 101 to the magnetic layer (4) (106). The procedures disclosed as from step 101 are continued until the data of the significant storage bit (41) is carried to the target layer. A current pulse is applied between the upper electrical contacts (22) and lower electrical contacts (21) of the optical units (2) located below all lower buffer bits (43) on the magnetic layers (4) on Which the significant bit is present if the lower layer is the target layer (107). Therefore, the state of the said bits (43) is transferred to the storage bits (41) of one lower layer (10$). Then, the bits the positions of which are shifted in step 101 are returned to their initial position by applying a current pulse in reverse direction to the current pulse applied in step 101 to the magnetic layer (4) (109). Then the processes are stopped (110).

In the inventive data storage method (100), in up transfer process, the storage bits (41) present next to the upper buffer bits (42) in the magnetic layer (4) on which the storage bit (41) wanted to be read is present are shifted to the position of the upper buffer bits (42) by applying a current pulse to the said layer (201). Then, whether the one upper layer is the target layer is determined (202). The upper buffer bits (42) present next to the storage bits (41) in the magnetic layer (4) located on one upper layer are shifted to the position of the storage bits (41) next to them by applying a current pulse to the said layer if the one upper layer is not the target layer (203). The said method is called as spin-torque induced domain wall motion in the state of the art. Then, a current pulse is applied between the upper electrical contacts (22) and lower electrical contacts (21) of the optical units (2) located above all upper buffer bits (42) on the magnetic layers (4) on which the said upper buffer bit (42) is present (204). Therefore all upper buffer bits (42) on the magnetic layer (4) on which the significant bit is present are copied to the storage bits (41) located on one upper layer corresponding right above the optical units (2) (205). After the data in the significant storage bit (41) is carried, the bits the positions of which are shifted in step 101 are returned to their initial positions by applying a current pulse in reverse direction to the current pulse applied in step 101 to the magnetic layer (4) (206). The procedures disclosed as from step 101 are continued until the data of the significant storage bit (41) is carried to the target layer. A current pulse is applied between the upper electrical contacts (22) and lower electrical contacts (21) of the optical units (2) located above all upper buffer bits (42) on the magnetic layers (4) on which the significant bit is present if the upper layer is the target layer (207). Therefore, the state of the said bits (43) is transferred to the storage bits (41) of one upper layer (208). Then, the bits the positions of which are shifted in step 201 are returned to their initial position by applying a current pulse in reverse direction to the current pulse applied in step 201 to the magnetic layer (4) (109). Then the processes are stopped (110).

Reading data can be realized by using methods such as GMR and TMR present in the state of art, but it is not limited to these.

By means of all lower buffer bits (43) or upper buffer bits (42) on a magnetic layer (4) being transferred on lower buffer bits (43) on one lower layer or upper buffer bits (42) on one upper layer at the same time in reading and recording procedures, data access speeds can be reduced to nanoseconds even to picoseconds.

In reading and recording procedures, power consumption of the said data storage system (1) is very little since it is not required to heat the significant bits or applying an external magnetic field to the said bits.

It is possible to develop various embodiments of the inventive opto-magnetic data storage system (1) and method (100). The invention cannot be limited to the examples described herein and it is essentially as defined in the claims.

The invention claimed is:

1. A three dimensional opto-magnetic data storage system comprising:

at least one top layer which comprises at least two first optical units arranged side by side such that there is a space between each two adjoining first optical units, at least one first thermal insulator located in the space and prevents heat transfer between two adjoining first optical units, and at least one first magnetic layer located on a plane formed by the first optical units and the first thermal insulator;

at least one intermediate layer which is located under the top layer and comprises at least two second optical units arranged side by side such that there is a space between each two adjoining second optical units, at least one second thermal insulator located in the space and prevents heat transfer between two adjoining second optical units, at least one second magnetic layer present on a plane formed by the second optical units and the second thermal insulator, and at least one first transparent layer present on the second magnetic layer; and at least one bottom layer which is located under the intermediate layer and comprises at least one third magnetic layer and at least one second transparent layer located on the third magnetic layer, wherein each of the first optical units and the second optical units enables a circularly polarized light required for recording data to be generated and further comprises:
- at least one active layer in which the circularly polarized light is generated,
- at least one lower electric contact enabling electric energy to be transferred to the active layer and having a circular shaped hole at the center to allow the circularly polarized light to pass,
- at least one upper electric contact enabling electric energy to be transferred to the active layer,
- at least two reflecting layers reflecting the circularly polarized light, wherein each of the first magnetic layer, the second magnetic layer and the third magnetic layer is manufactured from a ferromagnetic material suitable for opto-magnetic recording and comprises at least two storage bits and at least one upper buffer bit enabling data to be transferred up, and at least one lower buffer bit enabling data to be transferred downward therein, and wherein the first transparent layer transfers the circularly polarized light generated by each of the first optical units to the second magnetic layer, and the second transparent layer transfers the circularly polarized light generated by each of the second optical units to the third magnetic layer.

2. The three dimensional opto-magnetic data storage system according to claim 1, wherein the at least one intermediate layer further comprises a first intermediate layer which is placed to be below the top layer and a second intermediate layer which is
placed below the first intermediate layer; and
wherein the bottom layer is placed to be under the second intermediate layer.

3. The three dimensional opto-magnetic data storage system according claim 1, wherein the at least two storage bits, the at least one lower buffer bit, and the at least one upper buffer bit located in each of the first magnetic layer, the second magnetic layer, and the third magnetic layer are aligned such that one lower buffer bit is next to two storage bits and one upper buffer bit is next to said one lower buffer bit.

4. The three dimensional opto-magnetic data storage system according to claim 3, wherein a storage area in each of the first magnetic layer, the second magnetic layer, and the third magnetic layer is increased by adding one or more groups each comprised of two storage bits, one upper buffer bit next to said two storage bits, and one lower buffer bit next to said one upper bit.

5. The three dimensional opto-magnetic data storage system according to claim 1, wherein one of the at least two first optical units is positioned to be above the upper buffer bits present within the second magnetic layer, and another of the first optical units is positioned to be under the lower buffer bits present within the first magnetic layer, and
wherein one of the at least two second optical units is positioned to be under the lower buffer bits present within the second magnetic layer, and another of the at least two second optical units is positioned to be above the upper buffer bits present within the third magnetic layer.

6. The three dimensional opto-magnetic data storage system according to claim 1, wherein the first thermal insulator is positioned to be between the upper buffer bit in the first magnetic layer and the lower buffer bit in the second magnetic layer or positioned to be between the storage bit in the first magnetic layer and the storage bit in the second magnetic layer, and
wherein the second thermal insulator is positioned to be between the upper buffer bit in the second magnetic layer and the lower buffer bit in the third magnetic layer or positioned to be between the storage bits in the second magnetic layer and the storage bits in the third magnetic layer.

7. The three dimensional opto-magnetic data storage system according to claim 1, wherein each of the reflecting layers is formed by stacking layers each having the thickness as whole multiples of the quarter of the wavelength of the circularly polarized light.

8. The three dimensional opto-magnetic data storage system according to claim 1, wherein, the active later of each of the first optical units and the second the optical units is sandwiched by the reflecting layers.

9. The three dimensional opto-magnetic data storage system according to claim 1, wherein the upper electric contact of the first optical unit which is located on the upper buffer bit of the second magnetic layer is positioned between the second magnetic layer and the second thermal insulator; and wherein the lower electric contact of the first optical unit which is located on the upper buffer bit of the second magnetic layer is positioned right under the first magnetic layer.

10. The three dimensional opto-magnetic data storage system according to claim 1, wherein the lower electric contact of the first optical unit which is located under the lower buffer bit of the first magnetic layer is positioned between the second magnetic layer and the first transparent layer, and wherein the upper electric contact of the first optical unit which is located under the lower buffer bit of the first magnetic layer is positioned right above the first magnetic layer.

11. The three dimensional opto-magnetic data storage system according to claim 1, wherein each of the first optical units and the second optical units emits a circularly polarized electromagnetic wave.

12. The three dimensional opto-magnetic data storage system according to claim 1, wherein the first optical units and the second optical units that are located on the upper buffer bits are used for transferring a significant bit upwards.

13. The three dimensional opto-magnetic data storage system according to claim 1, wherein the first optical units and the second optical units that are located under the lower buffer bits are used for transferring a significant bit downwards.

14. The three dimensional opto-magnetic data storage system according to claim 1, wherein at least three empty bits are located at the far end of each of the first magnetic layer, the second magnetic layer, and the third magnetic layer.

* * * * *